United States Patent [19]

Feryszka et al.

[11] 3,823,332

[45] July 9, 1974

[54] MOS FET REFERENCE VOLTAGE SUPPLY

[75] Inventors: Rubin Feryszka, Somerville; Joseph Otto Preisig, Trenton, both of N.J.

[73] Assignee: RCA Corporation, New York, N.Y.

[22] Filed: Jan. 30, 1970

[21] Appl. No.: 7,148

[52] U.S. Cl. .................................. 307/297, 330/35

[51] Int. Cl. ............................................ H03k 1/12

[58] Field of Search ........ 307/297, 304; 330/22, 35, 330/40

[56] References Cited

UNITED STATES PATENTS

| | | | |
|---|---|---|---|
| 3,135,926 | 6/1964 | Bocksmuehl | 307/304 X |
| 3,434,068 | 3/1969 | Sevin | 330/35 X |
| 3,508,084 | 4/1970 | Warner | 307/304 |
| 3,518,584 | 6/1970 | Miller et al. | 307/304 X |

*Primary Examiner*—Herman Karl Saalbach
*Assistant Examiner*—James B. Mullins
*Attorney, Agent, or Firm*—Eugene M. Whitacre; Kenneth R. Schaefer

[57] ABSTRACT

A means for obtaining regulated reference supply voltages substantially at one or more integral multiples of the threshold voltage ($V_t$) of field effect transistors fabricated completely with field-effect-transistors on a single monolithic integrated circuit chip.

8 Claims, 4 Drawing Figures

INVENTORS
RUBIN FERYSZKA &
BY JOSEPH O. PREISIG
Martin Sachs
Attorney

MOS FET REFERENCE VOLTAGE SUPPLY

This invention relates to power supplies and, more particularly, to circuit arrangements for obtaining a reference voltage supply with MOS FET (metal-oxide-semiconductor field-effect-transistor) amplifiers which may be fabricated with integrated circuit techniques.

As used herein, the term integrated circuit refers to a unitary or monolithic semiconductor structure or chip incorporating the equivalent of a network of interconnected active and passive electrical circuit elements such as transistors, diodes, resistors, capacitors, and the like.

In order to properly bias semiconductor devices to their required operating points for linear amplifier applications, one or more bias voltages are required, each of which is substantially independent of changes in the main or B+ supply voltage.

The threshold voltage of a MOS FET device varies as a function of the substrate doping level and as a function of substrate bias voltage level. The substrate bias voltage level is defined as the voltage appearing between the source electrode of the device being considered and the substrate. Substrate bias voltages of devices on a single chip may have a range of voltages. The need for various bias voltages arises because of the manner of construction of the monolithic integrated chip. It is economical and convenient to manufacture the MOS FET chip with a common substrate connection for all the FET units on a common chip. This construction eliminates the requirement for isolation areas or boats between the individual MOS FET devices. It is also common practice to couple a MOS FET device as a load element (e.g., drain resistor) for another device or, as in differential amplifiers, to couple a MOS FET device as a current source for one or more other devices. Stacking of semiconductor or MOS FET devices across the D.C. voltage supply terminals requires the use of regulated voltage bias supplies of various values to bias the base or gate electrodes of each of the devices to its required operating point.

While the term threshold voltage is used herein for convenience, it should be recognized that this term does not relate to a single, fixed numerical value of voltage but rather is comprised of a temperature dependent voltage ($V_t$) plus an incremental voltage ($\Delta$) which depends on the level of the substrate bias as will be explained in detail below. Furthermore, the term multiple "$V_t$" will be used hereafter for convenience to refer to voltages which may be defined as the summation of threshold voltages of a plurality of MOS FET devices, the source of the $n^{th}$ device being at a voltage equal to the threshold voltage of the ($n^{th}$—1) device.

It is an object of this invention to provide a reference voltage supply circuit which is suitable for establishing and maintaining a stable reference voltage essentially independent of input supply voltage variations.

Another object of this invention is to provide a reference voltage supply, which provides one or more voltages, each of which is different and is substantially equal to the summation of an integral number of threshold voltages of MOS FET devices.

Still another object of the present invention is to provide a stable reference voltage supply independent of input supply voltage, constructed without capacitors and resistors, and fabricated on a monolithic integrated circuit chip.

A further object of this invention is to provide a stable MOS FET biasing circuit essentially independent of input supply variations which provides a plurality of bias voltages, each of which is equal to a summation of a different integral number of FET threshold voltages and is completely comprised of FET units fabricated on a monolithic semiconductor chip.

A regulated reference voltage supply circuit employing one embodiment of the invention utilizes relatively high impedance semiconductor devices in a first voltage divider network current path. The network couples a portion of an input D.C. voltage to a second current path comprised of at least two semiconductor devices one of which amplifies and invert the portion of D.C. voltage to cancel a change in voltage appearing across the amplifying device due to variations in the input voltage. The voltage across the amplifying device remains substantially constant at approximately an integral multiple of the threshold voltage of said devices.

Referring to the drawings.

Figure 1:
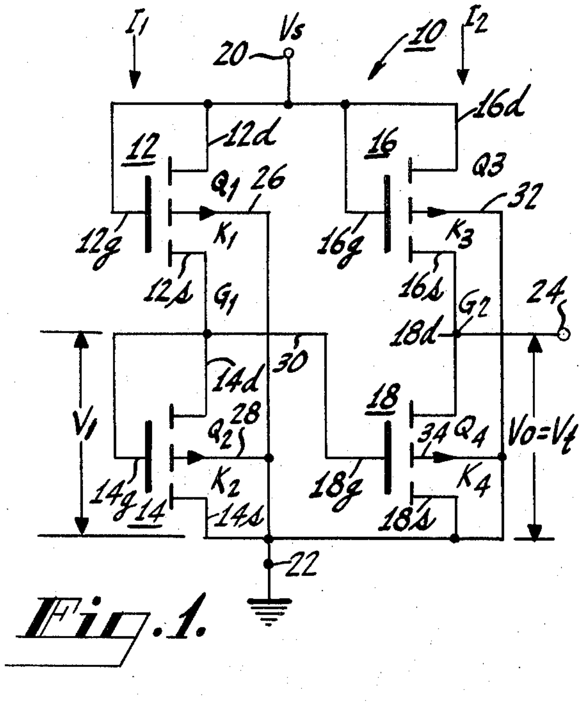
FIG. 1 is a schematic diagram of a single threshold voltage ($V_t$) reference voltage supply.

Referring to FIG. 1, a schematic diagram of a single threshold voltage bias supply 10 is shown. The threshold voltage supply 10 in the present embodiment of the invention is constructed on an integrated monolithic circuit chip and contains enhancement type metal-oxide-semiconductor field-effect-transistors (MOS FET's) 12, 14, 16 and 18, each having source, drain, gate and substrate electrodes. A negative input voltage supply ($V_s$) is impressed between input supply terminals 20 and 22 while an output voltage $V_o = V_t$ is obtained between terminal 22 and an output terminal 24. This output voltage is typically used to bias high input impendance MOS FET devices. Terminal 22 is coupled to a reference potential such as ground. The reference voltage supply 10 has two current paths from terminal 20 to terminal 22. One path may be considered to function as a resistance divider network consisting of FET's 12 and 14 while the other current path consists of a load unit (FET) 16 and an output or amplifier unit (FET) 18. The drain **12*d* of FET 12 is connected to the gate 12*g* of FET 12 while the source 12*s* of FET 12 is connected to the drain 14*d* of FET 14. The drain 14*d* is also connected to the gate 14*g* of FET 14 while source 14*s* is connected to terminal 22. The substrate 26 of FET 12 and the substrate 28 of FET 14 are connected in common with terminal 22. Since the drain and gate of each of FET's 12 and 14 are coupled together, each of FET's 12 and 14 serves as a resistor. The geometry of FET's 12 and 14** is selected to provide relatively large resistance values.

The series combination of FET 12 and FET 14 thereby functions as a voltage divider which provides a voltage $V_1$ between the ground terminal 22 and the junction 30 of source **12*s* and drain 14*d***.

The second current path is comprised of FET 16 which has its gate **16*g* and its drain 16*d* connected in common with terminal 20. The source 16***s* of FET 16 is connected to the drain 18*d* of FET 18 which is also connected to the output terminal 24. The gate 18*g* of FET 18 is connected to the junction 30 of source 12*s* and drain 14*d.* The source 18*s* is connected to terminal 22. The substrates 32 and 34 of FET's 16 and 18 are connected to the ground reference terminal 22. The geometry of FET 16 is selected such that FET 16 functions as a high impendance load for FET 18, while FET 18 functions as an amplifier and has a small effective resistance. As a first approximation (disregarding the variation of threshold voltage as a function of substrate bias voltage), the operation of the circuit may be explained generally by considering FET 12 and FET 14 as a voltage divider supplying a fraction or portion ($V_1$) of the input supply voltage ($V_s$) to the gate 18*g* of FET 18. If $V_s$ increases, since it is virtually divided by FET's 16 and 18, the voltage $V_o$ tends to increase. However, since $V_s$ is also coupled across the voltage divider 12, 14, the voltage $V_1$ also increases causing FET 18 to increase conduction. The voltage drop across the source-drain 16*s*–16*d* of FET 16 then also increases so as to tend to maintain the voltage $V_o$ at a substantially constant value. The voltage divider 12, 14 includes two source-drains connected in series (12*s*–12*d* and 14*s*–14*d*) across the input voltage $V_s$ and, if $V_s$ is increased from zero, just as current begins to flow in the first current path, $V_t$ appears across each of the source-drain combinations. In that case, the output voltage $V_o$ is equal to $2V_t$ minus the $V_t$ of FET 16, or $V_o = V' + V_{t14} - V_{t16} = V_t$ since $V_{t12} = V_{t14} = V_{t16}$.

A more rigorous explanation follows taking into account the effect of substrate bias voltage on the threshold voltage of the devices.

FET's 12, 14, 16 and 18 will be referred to as $Q_1$, $Q_2$, $Q_3$ and $Q_4$, respectively. $K_1$, $K_2$, $K_3$ and $K_4$ are device constants related, respectively to devices $Q_1$, $Q_2$, $Q_3$ and $Q_4$ and are defined as:

$$K = \mu \epsilon W / 2TL \quad (1)$$

where $\mu$ = effective mobility of carriers
$\epsilon$ = permittivity of the gate insulator
$W$ = channel width
$T$ = thickness of gate insulator
$L$ = channel length.

Assuming that $\mu$, $\epsilon$ and $T$ are the same for all the FET's; as they would be where devices $Q_1$, $Q_2$, $Q_3$ and $Q_4$ are fabricated simultaneously on a single MOS integrated circuit chip, then the voltage gain $G_1$ of a configuration consisting of $Q_1$, $Q_2$ and the voltage gain $G_2$ of a configuration consisting of $Q_3$ and $Q_4$ may be computed as:

$$G_1 = \sqrt{K_2/K_1} = \sqrt{W_2 L_1 / W_1 L_2}$$

and, $$G_2 = \sqrt{K_4/K_3} = \sqrt{W_4 L_3 / W_3 L_4}$$

which are dependent on device geometry (i.e., channel length and width).

The D.C. output $V_1$ of an amplifier divider comprised of $Q_1$ and $Q_2$ may be computer as:

$$V_1 = V_s/G_1+1 + V_t \sqrt{G_1-1/G_1+1} - \Delta V_{t1}/G_1+1 \quad (2)$$

where:

$V_s$ = supply voltage
$V_t$ = threshold voltage of a device having source and substrate shorted together;
$\Delta V_{t1}$ = change in threshold voltage of transistor $Q_1$ and since the substrate is back biased with respect to the source, may be shown to be given by:

$$\Delta V_{t1} = C(\sqrt{2\Phi_F - V_1} - \sqrt{2\Phi_F})$$

where $C = T/\epsilon \sqrt{2q\epsilon_S N}$
$\epsilon_S$ = silicon dielectric constant
$q$ = electronic charge = $1.6 \times 10^{-19}$ Coulomb
$N$ = substrate doping level
$\Phi_F$ = Fermi function potential Both transistor $Q_3$ and $Q_4$ operate in the saturation region (beyond pinch-off) then the D.C. output voltage of the second amplifier comprising transistors $Q_3$ and $Q_4$ may be shown to be given by:

$$V_o = V_s - G_2 V_1 + V_t(G_2-1) - \Delta V_{t2} \quad (3)$$

Substituting for $V_1$, from equation (2) yields:

$$V_o = V_s - G_2[(V_s/G_1+1) + V_t(G_1 - 1/G_1 + 1) - \Delta V_{t1}/G_1+1)] + V_t(G_2 - 1) - \Delta V_{t2}$$

The voltage gain of the second amplifier ($Q_3$, $Q_4$) is selected so that $G_2 = G_1+1$; then, $$V_o = V_t + \Delta V_{t2} \approx V_t$$

It should be noted that the threshold voltage $V_t$ is an inherent property of the materials which comprise the field-effect-transistor. It is determined by the surface state occupation (the number of trapped electrons) and the metal used for metalization in conjunction with the device processing and cannot be controlled to the extent that doping densities can be controlled. This is in contrast to the bipolar transistor where the threshold voltage is directly related to the semiconductor band gap. Therefore, the transfer characteristic of a bipolar transistor can be held to a tolerance of several millivolts while the process variables obtained today yield field-effect-transistors with an uncertainty in threshold voltage in the order of 0.5 volts. Consequently to provide reasonable uniformity between MOS FET devices used on integrated monolithic chips, the gain of each stage should be kept low in order that the threshold voltages be reasonably predicatable. As compared to an amplifier employing bipolar transistors, such a FET amplifier requires the use of additional stages to obtain the overall gain requirements met by the bipolar transistor devices.

Since a regulated voltage is readily obtainable at a multiple of $V_t$, these supplies are frequently used to supply the constant voltages necessary to bias the constant current sources of differential amplifiers.

Figure 2:
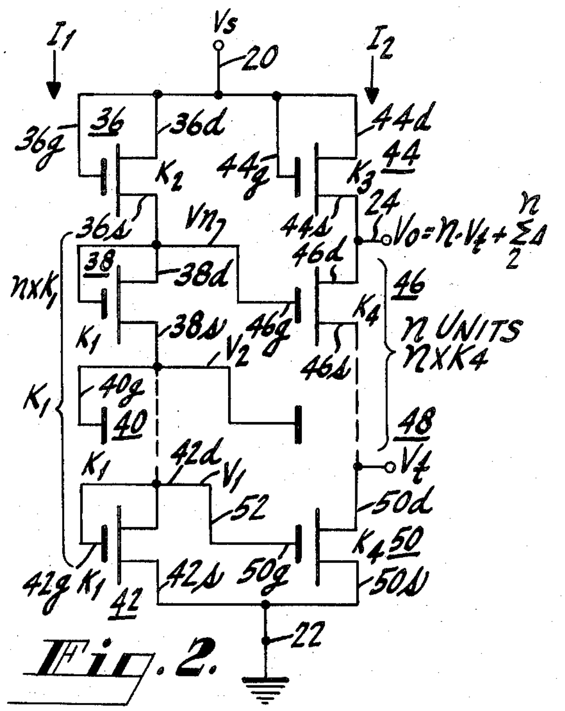
FIG. 2 is a schematic diagram of one embodiment of a multiple threshold voltage ($V_t$) reference voltage supply.

In FIG. 2 the schematic diagram of a multiple $V_t$ supply is shown wherein the input supply voltage is connected to terminal 20 with terminal 22 used as the positive reference ground. A first current path is provided between terminal 20 and ground through MOS FET devices 36, 38, 40, 42 connected in series, each unit having its drain connected to its gate. Any number of units may be connected in series in this manner. However, for proper operation, the value of the input supply voltage $V_s$ must be:

$$V_s > n \cdot V_t$$

for regulation to occur. The substrates of all units are in common and connected to point 22. The substrate connections have been omitted from the schematic for the purpose of clarity. The source of each successive unit is connected to the common gate-drain connection of the unit below until the source 42$_s$ of the last unit is connected to terminal 22, the common gate-drain connection of the uppermost unit 36*g–d* being connected to terminal 20.

A second current path is provided between terminal 22 and terminal 20 through FET units 44, 46, 48 and 50 or any number of units selected. The units 44–50 are connected in series, with the uppermost unit 44 having its gate-drain 44*g–d* connected in common to terminal 20 while its source 44*s* is connected to the drain 46*d* of the unit below. The last unit 50 has its source 50*s* connected to terminal 22. The total number of FET units chosen for the second current path $I_2$ should preferably be equal to, or less than the number of units in the $I_1$ current path.

The gate of the $n^{th}$ unit in the $I_2$ current path is connected to the common gate-drain point of the $n^{th}$ unit in the $I_1$ current path. For example, FET unit 50 is the first unit in the $I_2$ current path (closest to the substrate which is connected in common with all units to terminal 22). Therefore its gate 50*g* is connected by conductive means 52 to the junction of the gate-drain 42*g–d* of FET unit 42 which is the closest to the substrate (i.e., in operation, at one $V_t$). Similarly, the gate of each unit in the second current path is connected to the gate-drain of the corresponding unit in the first current path such that multiple "$V_t$" voltages may be provided at the drain electrodes of higher units is the second current path.

Since the units are operating above pinch-off the drain voltage ($V_d$) of any unit may be shown to be given by:

$$V_d \geqq V_g - V_t$$

where
$V_d$ = drain voltage
$V_g$ = gate voltage
$V_t$ = threshold voltage.

Taking into account the change in threshold voltage ($V_t$) depending on the bias of the source above the substrate we have for the second current path:

| | |
|---|---|
| $V_{t1}=V_{t1}$ | for the first unit |
| $V_{t2}=V_{t1}+\Delta_2$ | for the unit operating with a source $V_{t1}$ above the substrate |
| $V_{t3}=V_{t1}+\Delta_2+\Delta_3$ | for the unit operating with a source $(V_{t1}+V_{t2})$ above the substrate |
| $V_{t4}=V_{t1}+\Delta_2+\Delta_3+\Delta_4$ | for the unit operating with a source $(V_{t1}+V_{t2}+V_{t3})$ above the substrate |
| $V_{tn}=V_{t1}+\sum_2^n \Delta$ | for the unit operating with a source $\sum_1^n V_{tn}$ above the substrate |

where $\Delta_2$, $\Delta_3$, $\Delta_4$ are the incremental increases in threshold voltage depending on how many $V_t$ above the substrate the device is to operate.

And for the current path:

| | |
|---|---|
| $V_1=V_1$ | the voltage across the source-drain of the first unit |
| $V_2=(V_1+\Delta_2)$ | voltage across the source-drain of the second unit |
| $V_3=(V_1+\Delta_2+\Delta_3)$ | voltage across the source-drain of the third unit |
| $V_4=(V_1+\Delta_2+\Delta_3+\Delta_4)$ | voltage across the source-drain of the fourth unit |

then $V_n=nV_1+\sum_2^n \Delta$ is the voltage on the drain of the nth unit and $(V_1 - V_{t1}) = (V_1 - V_{t1})$
$(V_2 - V_{t2}) = V_1 + \Delta_2 - V_1 - \Delta_2$
$(V_2 - V_{t2}) = (V_1 - V_{t1})$ and $(V_3 - V_{t3}) = (V_1 + \Delta_2 + \Delta_3 - V_{t1} - \Delta_2 - \Delta_3)$
$(V_3 - V_{t3}) = (V_1 - V_{t1})$, etc.

therefore $(V_n - V_{tn})$ is a constant.

The current flow $I$ is given by:

$$I = K (V_g - V_t)^2$$

with $K$ as given in equation (1).

Therefore:

$$I_1 = K_1 (V_1 - V_{t1})^2 \quad (4)$$

since $V_1 = V_g$, and since the current is substantially the same through all units in the $I_1$ current path;

$$I_1 = K_2 (V_x - V_n - V_{tn})^2 \quad (5)$$

where:
$V_x = V_s$, the supply voltage
$V_n$ = voltage on the drain of the $n^{th}$ unit
$V_{tn}$ = threshold voltage of $n^{th}$ unit Similarly for the $I_2$ current path;

$$I_2 = K_4 (V_1 - V_{t1})^2 \quad (6)$$

also $$I_2 = K_3 (V_x - V_o - V_{tn})^2 \quad (7)$$

Equating the $I_1$ and $I_2$ expressions, (equations 4 and 5, and 6 and 7), yields:

$$I_1 = I_1 = K_1 (V_1 - V_{t1})^2 = K_2 (V_x - V_n - V_{tn})^2 \quad (8)$$

$$I_2 = I_2 = K_4 (V_1 - V_{t1})^2 = K_3 (V_x - V_o - v_{tn})^2 \quad (9$$

Taking the square root yields:

$$\sqrt{K_1} (V_1 - V_{t1}) = \sqrt{K_2} (V_x - V_n - V_{tn}) \quad (10)$$

$$\sqrt{K_4} (V_1 - V_{t1}) = \sqrt{K_3} (V_x - V_o - V_{tn}) \quad (11)$$

Dividing both sides of equation (11) by $\sqrt{K_3}$ and substituting $B = \sqrt{K_4/K_3}$ yields:

$B (V_1 - V_{t1}) = (V_x - V_o - V_{tn})$ then;

$BV_1 - BV_{t1} = V_x - V_o - V_{tn}$, and solving for $V_1$:

$$V_1 = (V_x - V_o - V_{tn} + BV_{t1}/B) = (V_x /B) - (V_o /B) - (V_{tn}/B) + V_{t1} \quad (12)$$

since $V_n=nV_1+\sum_2^n \Delta$ Equation (13)

substituting for $V_1$ (12) into (13) yields for $V_n$ $$V_n=\frac{nV_n}{B}-\frac{nV_o}{B}-\frac{nV_{tn}}{B}+nV_{t1}+\sum_2^n \Delta \quad \text{Equation (14)}$$

Equation (8) and (9) are cross multipled to yield:

$K_1 (V_1 - V_{t1})^2 \cdot K_3(V_x - V_o - V_{tn})^2 = K_4(V_1 - V_{t1})^2 \cdot K_2(V_x - V_n - V_{tn})^2$ dividing out $(V_1 - V_{t1})^2$ and moving all $K$'s to the left side yields:

$(K_1 \cdot K_3/K_4 \cdot K_2)\,(V_x - V_o - V_{tn})^2 = (V_x - V_n - V_{tn})^2$ Taking a square root and substituting $$A = \sqrt{K_1 \cdot K_3/K_4 \cdot K_2}, \quad (15)$$

yields $$A\,(V_x - V_o - V_{tn}) = (V_x - V_n - V_{tn}) \quad (16)$$

then $AV_o - AV_{tn} = V_x - V_n - V_{tn}$

Substituting equation (14) into equation (15) yields:

$$AV_o + \frac{nV_o}{B} = AV_x + \frac{nV_x}{B} - V_x - AV_{tn} - \frac{nV_{tn}}{B} + V_{tn} + nV_{t1} + \sum_2^n \Delta$$

or simplifying:

$$V_o\left(A+\frac{n}{B}\right) = V_x\left(A+\frac{n}{B}-1\right) + V_{tn}\left(1-A-\frac{n}{B}\right) + nV_{t1} + \sum_2^n \Delta$$

or $$V_o = \frac{V_x\left(A+\frac{n}{B}-1\right) + V_{tn}\left(1-A-\frac{n}{B}\right) + nV_{t1} + \sum_2^n \Delta}{\left(A+\frac{n}{B}\right)} \quad \text{Equation (17)}$$

To make $V_o$ independent of the line voltage $V_x$ its derivative $dV_o/dV_x$ must equal zero.

or:

$dV_o/dV_x = O = [A = (n/B) - 1]/[A + (n/B)\ ]$ for this to occur, then $A + (n/B) - 1 = O$ and $$A = 1 - (n/B) \quad (13)$$

Substituting equation (15) in equation (18) and remembering as before $B = \sqrt{K_4/K_3}$ then;

$$\sqrt{K_1/K_2} = \sqrt{K_4/K_3} - n \quad (19)$$

Equation (19) states that if one set of $K$ ratio values are chosen, eg., $(K_1/K_2)$, then the second set of $K$ ratio values $(K_4/K_3)$ is then determined by the number of threshold supply multiples for which constant output voltage will be obtained.

The output voltage is then given by substituting equation (18) into equation (17)

$$V_o = \frac{V_x(O) + V_{tn}(O) + nV_{t1} + \sum_2^n \Delta}{1}$$

or $$V_o = n \cdot V_t + \sum_2^n \Delta \quad \text{Equation (20)}$$

Equation (20) states that with the proper ratio chosen for $K_1$, $K_2$ and $K_4$, $K_3$ a regulated supply voltage independent of input voltage may be fabricated approximately equal to an integral value of $V_t$. The regulated voltage will also contain the proper incremental voltage ($\Delta$) added to it to insure matching to an FET threshold regardless of how many $V_t$'s it is biased from the substrate.

Thus it has been shown that by proper design of the $K$ factors of each FET an output voltage may be provided which will be essentially constant for input supply voltage variations and equal to any selected multiple of the threshold voltage.

Figure 3:
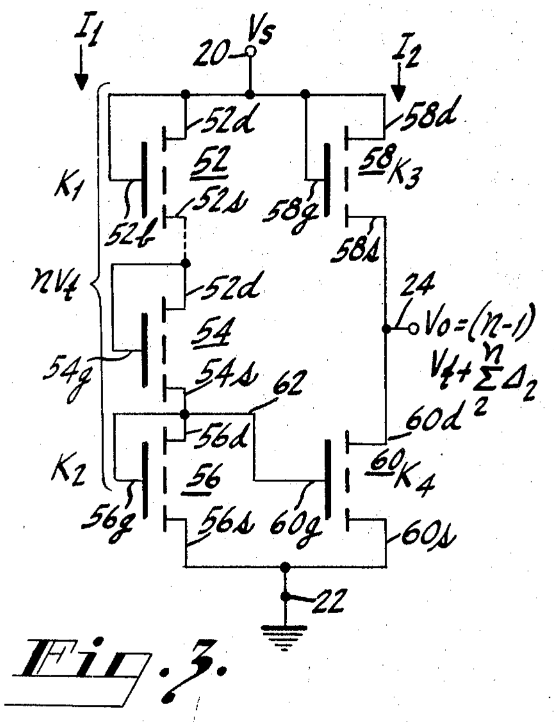
FIG. 3 is a schematic diagram of an alternate embodiment multiple threshold voltage ($V_t$) reference voltage supply.

FIG. 3 is an alternate embodiment multiple $V_t$ regulated supply which has only one output which is a multiple of $V_t$. The output is available between terminal 24 and terminal 22 while terminal 20 is used for the input supply voltage. FET units 52, 54 and 56 are connected in series to form one current path ($I_1$) with their gate-drain electrodes connected in common as before. Any number ($n$) units may be connected in series in this manner. A second current path ($I_2$) is formed by FET 58 and 60 connected in series. The gate-drain 58*g--d* of FET 58 is connected in common with terminal 20 and gate-drain 52 of FET 52. The source 58*s* is connected to output terminal 24 and the drain 60*d* of FET 60. The source 60*s* of FET is connected in common with the source 56*s* of FET 56 and terminal 22. The gate 60*g* of FET 60 is connected by conductive means 62 to the junction of the common gate-drain 56*g-D* of FET 56 and the source 54*s* of FET 54. Here again the number of FET units connected in series determines the source voltage $V_s$ required for proper regulation to occur. The output voltage $V_o$ would be equal to $(n-1)V_t$; where $n$ is the total number of units connected in series between terminals 20 and 22.

The embodiment depicted in FIG. 3 performs equally as well as that in FIG. 2 but requires less FET units of the $K_4$ type to be utilized, thereby consuming less space on the chip. It is to be noted that the equations for $I_2$ do not contain the $V_n$ term as shown above since $I_2$ is dependent on only $V_i 1 V_x$, $V_o$, and $V_t$. So that for FIG. 3 the equations may again be written:

$$I_1 = K_1\,(V_1 - V_t)^2 \quad (13)$$

$$I_1 = K_3\,(V_x - V_n - V_t)^2 \quad (14)$$

and $$I_2 = K_4\,(V_1 - V_t)^2 \quad (15)$$

$$I_2 = K_3\,(V_x - V_o - V_t)^2 \quad (16)$$

These equations 13, 14, 15, and 16 are identical to equations 4, 5, 6, and 7 for the circuit of FIG. 2 and the derivations would be identical thereby yielding the same regulated output as before, namely a single $V_o$ equal to $$n \cdot V_t + \sum_2^n \Delta.$$

Figure 4:
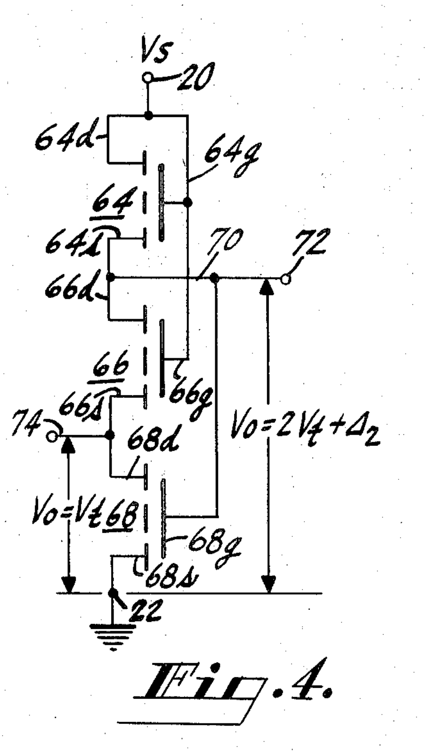
FIG. 4 is a schematic diagram of an alternate embodiment of a one $V_t$ and two $V_t$ reference voltage supply.

An alternate embodiment of a regulated voltage supply at one and two $V_t$ is shown in FIG. 4 wherein the input source voltage $V_s$ is connected to terminal 20 while terminal 22 is used as the positive reference ground. This circuit is not limited to a one and two $V_t$ supply but may yield higher $V_t$'s if additional units are connected in series. The common gate-drain 64*g-d* of FET 64 is connected to terminal 20 while the source 64*s* is connected to the drain 66*d* of FET 66. The gate 66*g* of FET 66 is connected to gate 64*g* of FET 64. The source 66*s* of FET 66 is connected to the drain 68*d* of FET 68 while the source 68s is connected to terminal 22. The gate 68g of FET 68 is connected to the common junction point 70 of source 64s and drain 66d which is also connected to output terminal 72. The output voltage at this point will be $2V_t$ while $V_t$ will be obtainable from terminal 74 which is connected to the junction of drain 68d and source 66s; both referenced to terminal 22.

The operation of this embodiment of the regulator may be described generally as follows: MOS FET 64 is connected to function as a high impedance resistor while FET's 66 and 68 function as amplifiers in the saturation region with a voltage drop across them equal to $V_t$. An increase in $V_s$ will increase the voltage on gates 66g and 68g thereby increasing the current flow from terminal 20 to 22 thereby increasing the drop across the source-drain 64s-d of FET 64 which will cause terminal 72 and 74 to remain at their original voltage of $2V_t$ and $V_t$ respectively. A rigorous mathematical proof of this circuit may be derived in accordance with the equations set forth earlier.

The present invention yields a circuit technique for generating regulated voltages substantially equal to an integral multiple of the threshold voltage of FET's. It is only comprised of field-effect-transistors and is readily adaptable for fabrication on a monolithic integrated circuit chip. The circuit may also be utilized with discrete components.

While the invention has been described in terms of a reference voltage bias network comprised of enhancement type MOS FET units, the network will perform equally as well with FET devices fabricated with other materials as well. Units which are all of the "N" or all of the "P" channel enhancement type may be utilized with proper selection of the input supply voltage.

What is claimed is:

1. A regulated reference voltage supply circuit comprising:

a pair of terminals adapted for connection across a direct voltage source;

at least $(n + 1)$ semiconductor devices connected in numerical order in a first series current path between said pair of terminals, each said device being a field effect transistor having at least source, drain and gate electrodes, the gate and drain electrodes of each said transistor being connected directly together, the joined gate and drain electrodes of the highest numbered one of said transistors being direct current coupled to a first one of said pair of terminals, the source of the first of said transistors being direct current coupled to a second one of said pair of terminals and the source of each additional one of said transistors being direct current coupled to the joined gate and drain of a succeeding one of said transistors, each said device being characterized by a relatively high impedance and a threshold conduction voltage;

a second series current path between said pair of terminals including at least a further high impedance semiconductor device and an output semiconductor device, said output device having input, output and common electrodes; and means direct current coupling said input electrode of said output device to the junction between the $n^{th}$ and $(n^{th} + 1)$ of said semiconductor devices in said first current path for providing between said output and common electrodes a voltage substantially equal to the summation of threshold voltage of $n$ of said $(n + 1)$ semiconductor devices.

2. A regulated reference voltage supply circuit according to claim 1 wherein said further high impedance semiconductor device is directly connected to one of said terminals.

3. A regulated reference voltage supply according to claim 1 wherein each said semiconductor device in said second current path is a field-effect-transistor having at least a source electrode, a gate electrode, and a drain electrode, the gate and drain electrodes of said high impedance device being directly connected together to said first terminal, said source electrode of said high impedance device being coupled to the drain electrode of said output device, said source electrode of said output device being connected to said second terminal, and wherein said input electrode of said output device corresponds to said gate electrode, the output electrode of said output device corresponds to said drain electrode, and said common electrode of said output device corresponds to said source electrode.

4. A regulated reference voltage supply circuit according to claim 3 wherein each said transistor is a metal-oxide-semiconductor field-effect-transistor.

5. A regulated reference voltage supply circuit comprising:

a pair of terminals adapted for connection across a direct voltage source;

a first high impedance semiconductor device having at least a source electrode, a drain electrode, and a gate electrode;

a second and a third output semiconductor device each having at least a source electrode, a drain electrode, and a gate electorde;

means for connecting the drain and gate electrodes of said first high impedance device to the first terminal of said pair of terminals;

means for connecting the source electrode of said first device to the drain electrode of said second device and to a first output terminal;

means for connecting the gate electrode of said second device to the gate electrode of said first high impedance device, to the drain electrode of said first high impedance device, and to said first terminal;

means for connecting the source electrode of said second device to the drain electrode of said third device and to a second output terminal;

means for connecting the source electrode of said third device to the second terminal of said pair of terminals; and means connecting the gate electrode of said third device to said first output terminal for providing between said first output terminal and said second terminal and between said second output terminal and said second terminal voltages substantially equal to the summation of threshold voltages of corresponding numbers of said semiconductor devices.

6. A regulated reference voltage supply circuit comprising:

at least a first and a second relatively high impedance field effect transistor adapted for connection across a source of D.C. voltage, said source of voltage having a first terminal and a second terminal, each said transistor having direct connected gate and drain electrodes and a source electrode, the drain to source paths of said transistors being coupled in series relation;

a third relatively high impedance field effect transistor having at least a drain, a gate connected to said drain and a source, said drain being connected to said first terminal; and amplifying means comprising a semiconductor amplifying device having an output electrode, a common electrode and an input electrode, said output electrode being coupled to said source of said third relatively high impedance transistor, said amplifying means further comprising means direct coupling said input electrode to the junction between said first and second high impedance transistors for providing between said output electrode and said second terminal a voltage substantially equal to the threshold voltage of said first transistor.

7. A regulated reference voltage supply circuit comprising:

at least first and second relatively high impedance semiconductor devices adapted for series connection across a source of D.C. voltage, said source of voltage having a first terminal and a second terminal;

a third relatively high impedance semiconductor device having at least a first electrode and a second electrode, said first electrode being connected to said first terminal;

at least one additional relatively high impedance semiconductor device coupled in series between said first and second semiconductor devices; and amplifying means comprising a semiconductor amplifying device and additional amplifying devices, each having output and common electrodes connected in series between said second electrode of said third relatively high impedance device and said second terminal, each said amplifying device further having an input electrode, said amplifying means further comprising means direct coupling each said input electrode of said amplifying devices to a corresponding one of the junctions between said series-coupled high impedance semiconductor devices for providing between each said output electrode and said second terminal a voltage equal substantially to the summation of threshold voltages of those of said high impedance devices coupled between the corresponding input electrode and said second terminal.

8. A regulated reference voltage supply circuit according to claim 7 wherein said first, second, third, and additional relatively high impedance semiconductor devices, said amplifying means, and additional amplifying devices are field-effect-transistors each having at least a gate electrode, a drain electrode and a source electrode, said gate and drain electrodes of said first, second, and third devices being connected in common and said input and output electrodes of said semiconductor amplifying device being the gate and drain electrodes respectively of said amplifying device.

* * * * *

UNITED STATES PATENT OFFICE
CERTIFICATE OF CORRECTION

Patent No. 3,823,332 Dated July 9, 1974

Inventor(s) Rubin Feryszka and Joseph Otto Preisig

It is certified that error appears in the above-identified patent and that said Letters Patent are hereby corrected as shown below:

Col. 3, line 31, "$V_o = V^{\prime}+_{Vt14}$" should read -- $V_o = V_{t12} + V_{t14}$ --; line 64, "computer" should read -- computed --; line 65, "$\sqrt{G_1 - 1/G_{1-}+ 1}$" should read -- $\sqrt{G_1 - 1/G_1 + 1}$ --. Col. 4, line 20 and line 21, $V_o = V_s - G_2[(V_s/G_1 + 1) + V_t(G_1 - 1/G_1 + 1) - \Delta V_{t1}/G_1 + 1)] + V_t\ (G_2 - 1) - \Delta V_{t2}$" should read $$-- V_o = V_s - G_2 \left[ \frac{V_s}{G_1+1} + V_t \left( \frac{G_1-1}{G_1+1} \right) - \frac{\Delta V_{t1}}{G_1+1} \right] + V_t(G_2-1) - \Delta V_{t2} --;$$

line 43, "predicatable" should read -- predictable --. Col. 6, line 8, "$(V_2 - V_{t2}) = V_1 + \Delta_2 - V_1 - \Delta_2$" should read -- $(V_2 - V_{t2}) = V_1 + \Delta_2 - V_{t1} - \Delta_2$ --. Col. 7, line 15, "$AV_o - AV_{tn}$" should read -- $AV_x - AV_o - AV_{tn}$ --; line 42, "[A = (n/B)" should read -- [A + (n/B) --; line 44, "13" should read -- 18 --. Col. 8, line 38, "$V_1|V_x$," should read -- $V_1$, $V_x$, --. Col. 9, line 12, "amplifiers in the" should read -- amplifiers operating in the --.

Signed and sealed this 24th day of December 1974.

(SEAL)
Attest:

McCOY M. GIBSON JR.
Attesting Officer

C. MARSHALL DANN
Commissioner of Patents